(12) United States Patent
Nakaya

(10) Patent No.: US 8,694,948 B2
(45) Date of Patent: Apr. 8, 2014

(54) RECONFIGURABLE CIRCUIT GENERATION DEVICE, METHOD, AND PROGRAM

(75) Inventor: Shogo Nakaya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/130,215

(22) PCT Filed: Nov. 27, 2009

(86) PCT No.: PCT/JP2009/070009
§ 371 (c)(1),
(2), (4) Date: May 19, 2011

(87) PCT Pub. No.: WO2010/061911
PCT Pub. Date: Jun. 3, 2010

(65) Prior Publication Data
US 2011/0225558 A1 Sep. 15, 2011

(30) Foreign Application Priority Data
Nov. 28, 2008 (JP) .................................. 2008-304164

(51) Int. Cl.
*G06F 17/50* (2006.01)
*G06F 9/455* (2006.01)

(52) U.S. Cl.
USPC ........... 716/132; 716/110; 716/111; 716/116; 716/117; 716/136

(58) Field of Classification Search
USPC ......... 716/100–105, 110–111, 116–117, 132, 716/136; 326/37–41, 16
See application file for complete search history.

(56) References Cited

U.S. PATENT DOCUMENTS

| 5,841,157 A | 11/1998 | Kojima et al. |
| 6,704,910 B2 * | 3/2004 | Hong ............................. 716/104 |
| 6,829,756 B1 * | 12/2004 | Trimberger .................... 326/38 |
| 6,876,962 B2 * | 4/2005 | Reblewski ...................... 703/26 |
| 6,938,236 B1 * | 8/2005 | Park et al. ...................... 716/103 |
| 7,051,313 B1 | 5/2006 | Betz et al. |
| 7,703,065 B2 * | 4/2010 | Osann, Jr. ...................... 716/128 |
| 2006/0184912 A1 | 8/2006 | Takano |
| 2009/0019404 A1 | 1/2009 | Sadakane |

FOREIGN PATENT DOCUMENTS

| JP | 10-41475 A | 2/1998 |
| JP | 2002-7497 A | 1/2002 |
| JP | 2002-342396 A | 11/2002 |
| JP | 2006-172219 A | 6/2006 |
| JP | 2009-20786 A | 1/2009 |
| JP | 2010-061514 A | 3/2010 |

OTHER PUBLICATIONS

Notice of Grounds for Rejection, dated May 21, 2013, issued by the Japanese Patent Office in counterpart Japanese application No. 2010-540520.

* cited by examiner

*Primary Examiner* — Nghia Doan
(74) *Attorney, Agent, or Firm* — Sughrue Mion, PLLC

(57) ABSTRACT

A reconfigurable circuit generation device comprises: a netlist generation unit that generates as a shared netlist a netlist that can be shared among a plurality of netlists having a common portion, and a resource reduction unit that reduces resources of the reconfigurable circuit where the plurality of netlists are to be implemented, in a range in which the shared netlist can be implemented.

16 Claims, 12 Drawing Sheets

10

11

12

RECONFIGURABLE CIRCUIT GENERATION DEVICE, METHOD, AND PROGRAM

TECHNICAL FIELD

Reference to Related Application

The present invention is based upon and claims the benefit of the priority of Japanese Patent Application No. 2008-304164 (filed on Nov. 28, 2008), the disclosure of which is incorporated herein in its entirety by reference thereto. The present invention relates to a reconfigurable circuit generation device, method, and program that generate a reconfigurable circuit, and in particular, relates to a reconfigurable circuit generation device, method, and program that generate a reconfigurable circuit with a limited application range.

BACKGROUND

Reconfigurable circuits such as a FPGA (Field Programmable Gate Array) or a PLD (Programmable Logic Device) are widely used since they enable a huge variety of circuits to be realized. However, many switches and wires are used in order to realize high flexibility, and there is a problem in that the area of reconfigurable circuits is large and costs are high.

In order to solve this problem, it is possible to use a reconfigurable circuit (referred to below as an application specific reconfigurable circuit) in which an application range of the reconfigurable circuit is limited, and the reconfigurable circuit is provided with flexibility that is adequate for covering the application range. In the application specific reconfigurable circuit, although flexibility is low in comparison with a general purpose reconfigurable circuit, there is an advantage in that it is possible to considerably reduce area. For example, Patent Documents 1 and 2 describe a method of generating an application specific reconfigurable circuit.
[Patent Document 1]
U.S. Pat. No. 7,051,313
[Patent Document 2]
U.S. Pat. No. 6,631,510

SUMMARY

It is to be noted that the entire disclosures of the abovementioned patent documents are incorporated herein by reference thereto. The following analysis is given by the present invention. FIG. 12 schematically shows a flowchart of a method of generating an application specific reconfigurable circuit as described in Patent Documents 1 and 2.

Referring to FIG. 12, first an initial architecture of a reconfigurable circuit is created (step S21). Next, a layout and wiring tool corresponding to the initial architecture is generated (step S22). Next, layout and wiring of a netlist is performed for an application to be implemented in the reconfigurable circuit, for the initial architecture using the layout and wiring tool (step S23). Furthermore, a result of the layout and wiring of the netlist is evaluated (step S24). As a typical evaluation, for example, an evaluation is made as to whether or not the layout and wiring of the netlist for the architecture has been done.

In a case of implementing a plurality of applications on a reconfigurable circuit, layout and wiring (step S23), and evaluation (step S24) are repeated, with regard to a netlist for each application. When an evaluation of netlists for all applications is completed (YES in step S25), a judgment is made as to whether or not to continue an architecture search (step S26). For example, when layout and wiring of all applications have been done, the architecture search may be continued, or otherwise the architecture search may be ended. In a case where the architecture search is continued (YES in step S26), the architecture of the reconfigurable circuit is changed (step S27), and steps S22 to S25 are again performed. As an architecture change, for example, the number of programmable wires of the reconfigurable circuit may be changed, or the number of programmable switches may be changed.

From the above steps, it is possible to generate an application specific reconfigurable circuit where resources of the reconfigurable circuit are reduced in a range in which the layout and wiring of the netlists for all applications can be done.

In the abovementioned reconfigurable circuit generation method described in Patent Documents 1 and 2, there is a problem in that processing time becomes long. This is because, in a case where the layout and wiring of the netlists is performed one by one for all applications and the evaluation is performed, the layout and wiring must be repeated in accordance with the number of applications.

Furthermore, according to the reconfigurable circuit generation method described in Patent Documents 1 and 2, in a case where the number of netlists to be implemented increases, there is a problem in that it is difficult to reduce the area of the reconfigurable circuit. This is because the layout and wiring are performed individually for the netlists, and reduction of resources of the reconfigurable circuit is performed in a range in which it is possible to perform layout and wiring of all the netlists.

Accordingly, there is a need in the art to provide a reconfigurable circuit generation device, method, and program that generate a reconfigurable circuit of small area in a short time is a problem.

According to a first aspect of the present invention, there is provided a reconfigurable circuit generation device comprising: a netlist generation unit that generates as a shared netlist a netlist that can be shared among a plurality of netlists having a common portion; and a resource reduction unit that reduces resources of a reconfigurable circuit where said plurality of netlists are to be implemented in a range in which said shared netlist can be implemented.

According to a second aspect of the present invention, there is provided a reconfigurable circuit generation method comprising: generating as a shared netlist a netlist that can be shared among a plurality of netlists having a common portion; and reducing resources of a reconfigurable circuit where said plurality of netlists are to be implemented in a range in which said shared netlist can be implemented.

According to a third aspect of the present invention, there is provided a program causing a computer to execute: generating as a shared netlist a netlist that can be shared among a plurality of netlists having a common portion; and reducing resources of a reconfigurable circuit where said plurality of netlists are to be implemented in a range in which said shared netlist can be implemented. According to a fourth aspect of the present invention, there is provided a reconfigurable circuit generation device comprising: a netlist generation unit that generates as a shared netlist a netlist that is a common portion among a plurality of netlists, added by differences between the common portion and each of the plurality of the netlists; and a resource reduction unit that implements said shared netlist on a reconfigurable circuit, where said plurality of netlists are to be implemented, by using resources necessary for implementing said shared netlist out of resources of the reconfigurable circuit. According to a fifth aspect of the present invention, there is provided a reconfigurable circuit generation method comprising: generating as a shared netlist a netlist that is a common portion among a plurality of netlists, added by differences between the common portion and each of the plurality of the netlists; and implementing said shared netlist on a reconfigurable circuit, where said plurality of netlists are to be implemented, by using resources necessary for implementing said shared netlist out of resources of the reconfigurable circuit. According to a sixth aspect of the present invention, there is provided a program causing a computer to execute: generating as a shared netlist a netlist that is a common portion among a plurality of netlists, added by differences between the common portion and each of the plurality of the netlists; and implementing said shared netlist on a reconfigurable circuit, where said plurality of netlists are to be implemented, by using resources necessary for implementing said shared netlist out of resources of the reconfigurable circuit.

The present invention provides the following advantage, but not restricted thereto. With a reconfigurable circuit generation device, method, and program according to the present invention, it is possible to generate an application specific reconfigurable circuit of small area in a short time.

PREFERRED MODES

First Exemplary Embodiment

Figure 1:
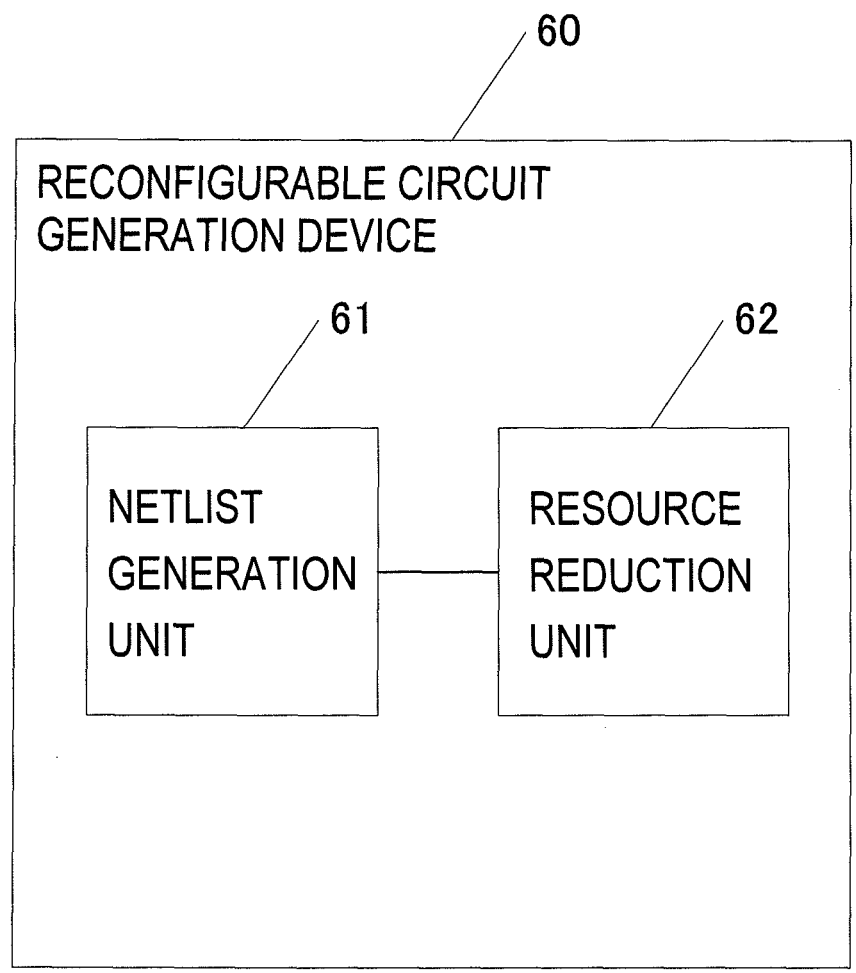
FIG. 1 is a block diagram showing a configuration of a reconfigurable circuit generation device according to a first exemplary embodiment.

A description will be given concerning a reconfigurable circuit generation device according to an exemplary embodiment, making reference to the drawings. FIG. 1 is a block diagram showing a configuration of a reconfigurable circuit generation device according to a first exemplary embodiment.

Referring to FIG. 1, the reconfigurable circuit generation device 60 comprises a netlist generation unit 61 and a resource reduction unit 62. The netlist generation unit 61 generates as a shared netlist a netlist that can be shared among a plurality of netlists having a common portion. The resource reduction unit 62 reduces resources of a reconfigurable circuit where the plurality of netlists are to be implemented, in a range in which the shared netlist can be implemented.

Furthermore, the plurality of netlists and the shared netlist may respectively include operation blocks and nets connecting the operation blocks. In this case, the shared netlist may share nets as much as possible among the plurality of netlists.

Furthermore, resources of the reconfigurable circuit may include functional blocks and routing resources connecting the functional blocks. In this case, the resource reduction unit 62 may reduce routing resources.

The netlist generation unit 61 may further comprise: a classification unit that classifies a plurality of netlists into a plurality of groups; and a generation unit that generates as a shared netlist, for each of the groups, a netlist that can be shared among the plurality of netlists included in each of the plurality of groups. In this case, the resource reduction unit 62 preferably reduces the resources of the reconfigurable circuit in a range in which all the shared netlists for the plurality of groups can be implemented.

The netlist generation unit 61 may further comprise: a classification unit that classifies a plurality of netlists into a plurality of groups; a first generation unit that generates as a first shared netlist, for each of the plurality of the groups, a netlist that can be shared among a plurality of netlists included in each of the plurality of groups; and a second generation unit that generates as a second shared netlist a netlist that can be shared among the first shared netlists. In this case, the resource reduction unit 62 may reduce resources of the reconfigurable circuit in a range in which the second shared netlist can be implemented.

Second Exemplary Embodiment

Figure 2:
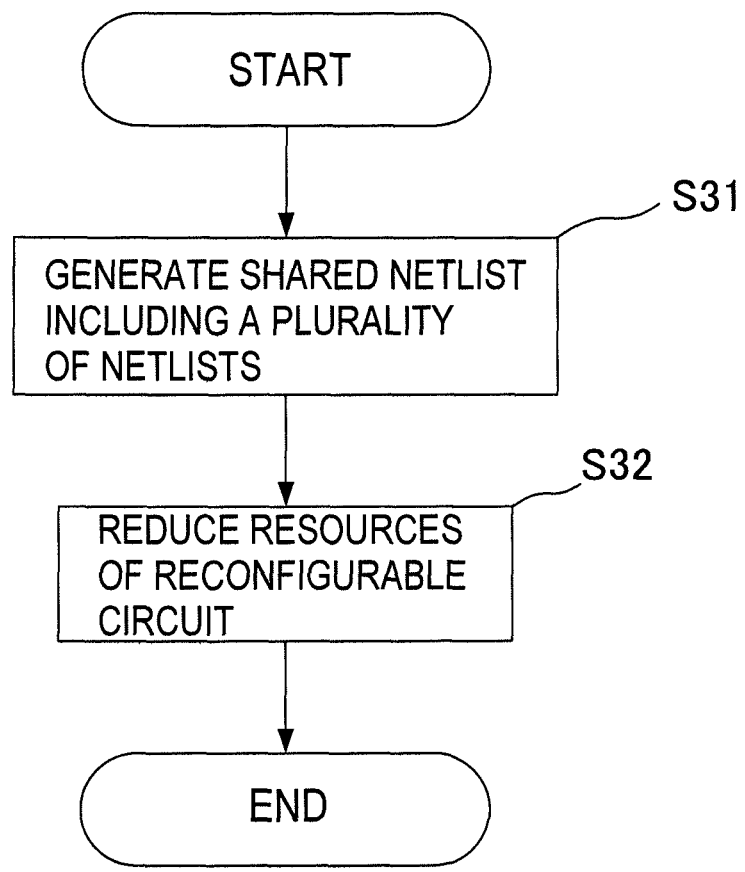
FIG. 2 is a flowchart of a reconfigurable circuit generation method according to a second exemplary embodiment.

A description will be given concerning a reconfigurable circuit generation method according to an exemplary embodiment, making reference to the drawings. FIG. 2 is a flowchart of the reconfigurable circuit generation method according to the present exemplary embodiment.

Referring to FIG. 2, first, generate as a shared netlist a netlist that can be shared among a plurality of netlists having a common portion (step S31). Next, reduce resources of a reconfigurable circuit where the plurality of netlists are to be implemented in a range in which the shared netlists can be implemented (step S32).

Furthermore, the plurality of netlists and the shared netlists may respectively include operation blocks and nets connecting the operation blocks. In this case, the shared netlists may share nets as much as possible among the plurality of netlists.

Furthermore, the resources of the reconfigurable circuit may include functional blocks and routing resources connecting the functional blocks. In this case, the routing resources may be reduced in the resource reduction step (step S32).

The netlist generation step (step S31) may further comprise: classifying the plurality of netlists into a plurality of groups; and generating for each of the plurality of the groups a shared netlist that can be shared among the plurality of netlists included in each of the groups. In this case, in the resource reduction step (step 32), resources of the reconfigurable circuit may be reduced in a range in which all of the shared netlists for the plurality of groups can be implemented.

The netlist generation step (step S31) may further comprise: classifying a plurality of netlists into a plurality of groups; generating for each of the plurality of the groups a first shared netlist that includes the plurality of netlists, by extracting a common portion among a plurality of netlists included in each of the plurality of the groups; and generating as second shared netlist a netlist that can be shared among the first shared netlists. In this case, in the resource reduction step (step S32), resources of the reconfigurable circuit may be reduced in a range in which the second shared netlist can be implemented.

Third Exemplary Embodiment

Figure 3:
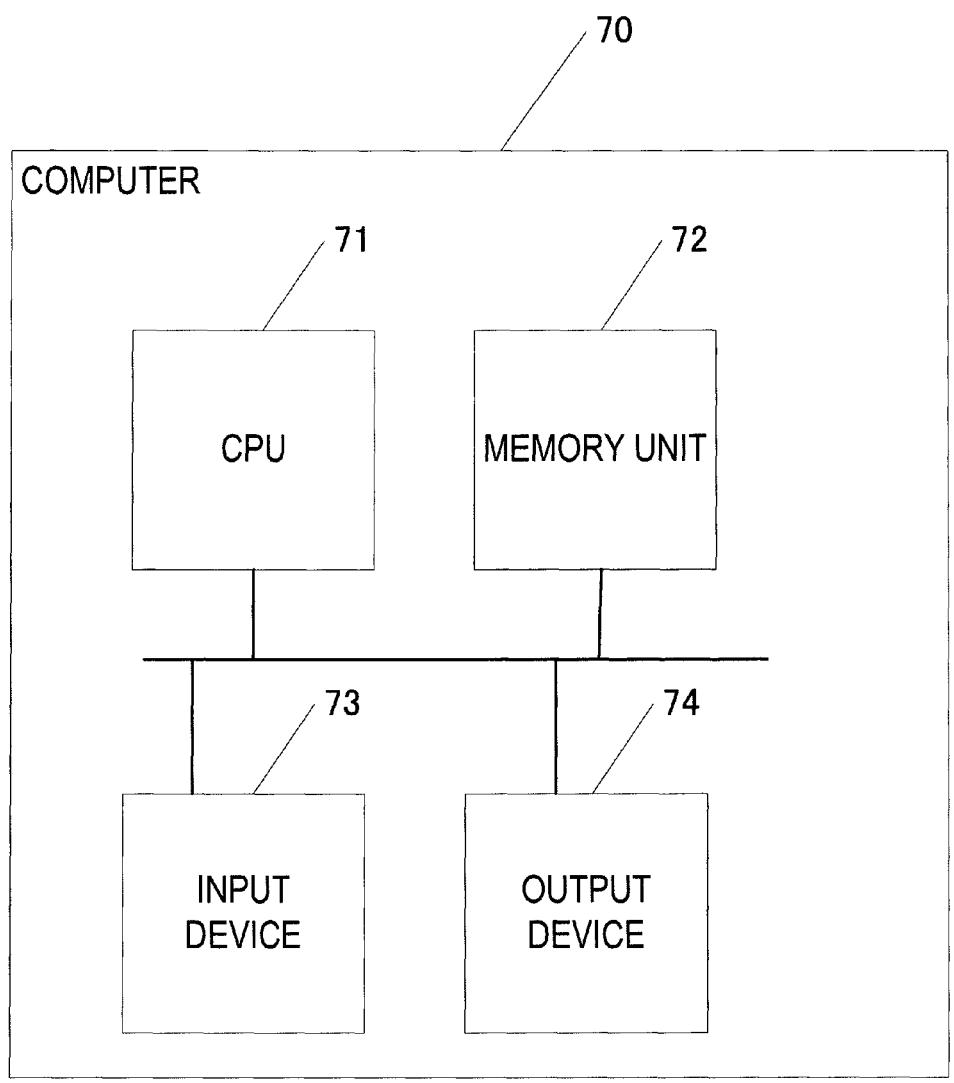
FIG. 3 is a block diagram showing a configuration of a computer that executes processing in a program according to a third exemplary embodiment.

A description will be given concerning a program according to a third exemplary embodiment for generating a reconfigurable circuit, making reference to the drawings. FIG. 3 is a block diagram showing a configuration of a computer that executes processing in a program according to the present exemplary embodiment. Referring to FIG. 3, the computer 70 comprises a CPU 71, a memory unit 72, an input device 73, and an output device 74.

The reconfigurable circuit generation program causes a computer to execute a netlist generation process of generating as a shared netlist a netlist that can be shared among a plurality of netlists having a common portion, and a resource reduction process for reducing resources of the reconfigurable circuit where the plurality of netlists are to be implemented, in a range in which the shared netlist can be implemented.

In the first to third exemplary embodiments, it is preferable to generate a netlist that can be shared among the plurality of netlists (that is, a shared netlist), so that the plurality of netlists are mutually superimposed to the maximum extent. Furthermore, the shared netlist is preferably targets of layout and wiring.

According to the reconfigurable circuit generation device, method, and program of the first to third exemplary embodiments, it is possible to generate a reconfigurable circuit of small area with a limited application range, in a short time. The reason for this is that a shared netlist that can be shared among the plurality of netlists is generated in advance, and resources of the reconfigurable circuit are reduced in a range where layout and wiring of the shared netlist can be performed. It is to be noted that each of the plurality of netlists can be generated by removing a portion of the shared netlists. Therefore, in a case where layout and wiring of the shared netlist can be performed on the reconfigurable circuit, it is possible to perform layout and wiring of all of the plurality of netlists that share the shared netlist.

Furthermore, in a case where layout and wiring of the plurality of netlists is performed individually for the reconfigurable circuit, it is necessary to perform layout and wiring according to the number of netlists. However, in a case of using a single shared netlist, it is possible to validate that layout and wiring can be performed for all the netlists in the reconfigurable circuit, by one layout and wiring. In this way, in comparison to methods described in Patent Documents 1 and 2, it is possible to generate the application specific reconfigurable circuit in a short time.

Furthermore, in a case of using the shared netlist, layout and wiring is performed for a common portion of the plurality of netlists for the same resources in the reconfigurable circuit. Therefore, variation in resources used by the common portion of the plurality of netlists is restrained, and more resource reduction is possible. Consequently, by using the shared netlist, it is possible to realize the application specific reconfigurable circuit with a small area.

First Example

Figure 4:
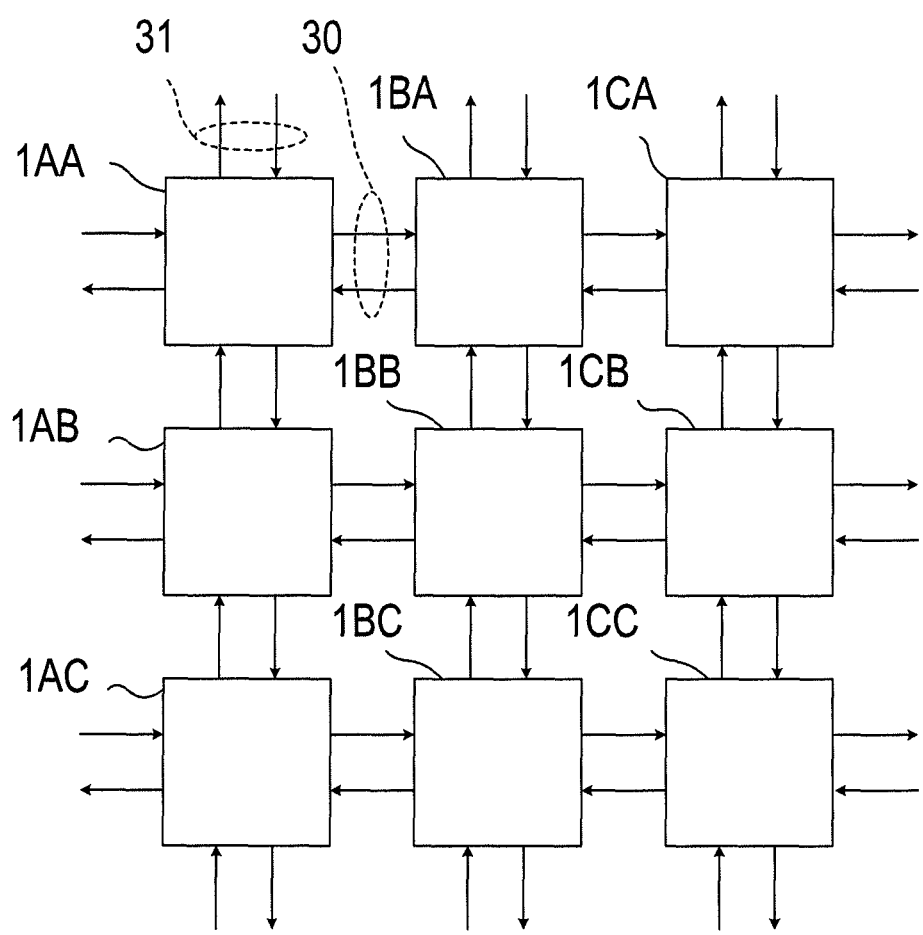
FIG. 4 is a block diagram showing a configuration of an exemplary reconfigurable circuit.

A description is given concerning a first example, making reference to the drawings. FIG. 4 is a block diagram showing a configuration of an exemplary reconfigurable circuit.

Referring to FIG. 4, the reconfigurable circuit comprises cells 1AA to 1CC. FIG. 4 shows, as an example, a cell array of 3 rows and columns. It is to be noted that the array size is arbitrary. Adjacent cells are connected by lateral wiring 30 and longitudinal wiring 31. The lateral wiring 30 in FIG. 4 connects adjacent cells to the left and right, and the longitudinal wiring 31 connects adjacent cells above and below. As an example, FIG. 4 shows a case where the number of wires connecting adjacent cells is two. However, the number of wires is arbitrary.

Figure 5:
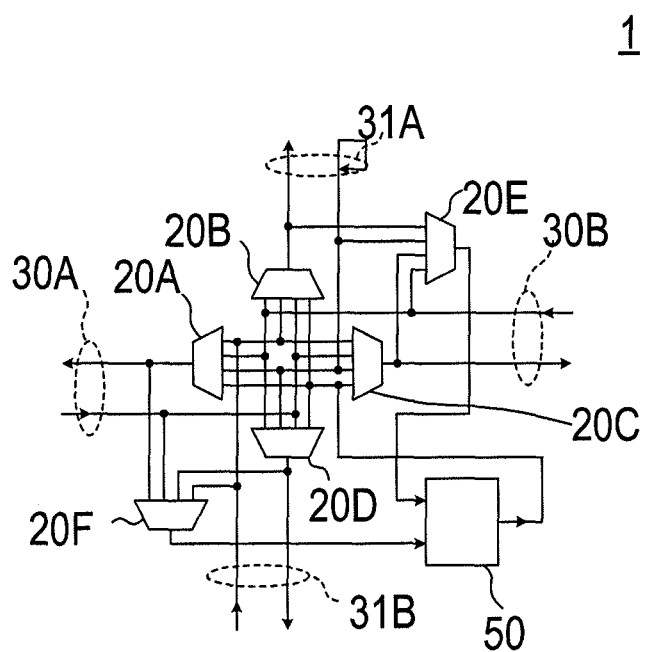
FIG. 5 is a circuit diagram showing an exemplary configuration of a cell forming a reconfigurable circuit.

FIG. 5 is a circuit diagram showing an exemplary configuration of a cell included in the reconfigurable circuit. A cell 1 comprises: wires 31A and 31B that transmits a signal in a longitudinal direction and wires 30A and 30B that transmits a signal in a lateral direction; a functional block 50 on which various functions can be set in accordance with configuration data; multiplexers 20E and 20F that select an input signal to the functional block 50 from wire groups 30A, 30B, 31A, and 31B, in accordance with the configuration data; and multiplexers 20A, 20B, 20C, and 20D that connect wiring of the wire groups 30A, 30B, 31A, and 31B in accordance with the configuration data, or wiring and output of the functional block 50.

Figure 6:
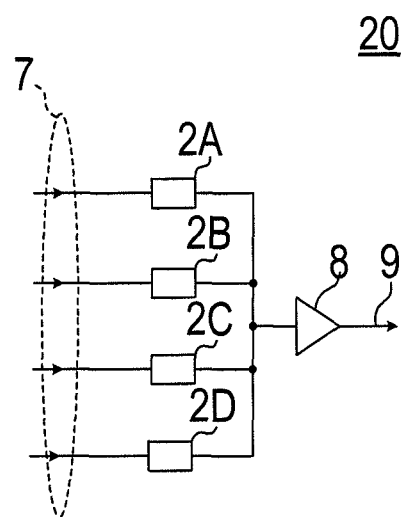
FIG. 6 is a circuit diagram showing an exemplary configuration of a multiplexer configuring a cell.

FIG. 6 is a circuit diagram showing an exemplary configuration of a multiplexer 20 included in a cell 1 of FIG. 5. A plurality of input signal lines 7 of the multiplexer 20 are connected to one end of respective switches 2A to 2D. Other ends of the switches 2A to 2D are connected to input of a buffer 8. Output of the buffer 8 is outputted to an output signal line 9.

Figure 7:
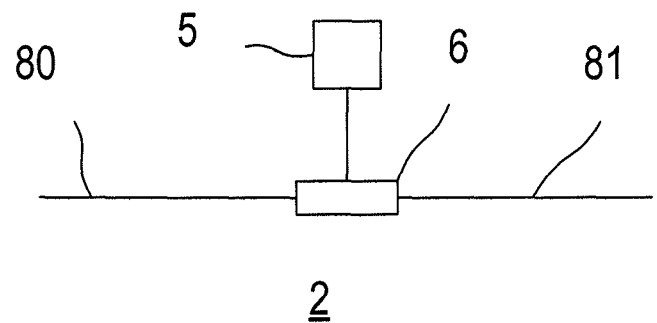
FIG. 7 is a circuit diagram showing an exemplary configuration of a switch configuring a multiplexer.

FIG. 7 is a circuit diagram showing an exemplary configuration of a switch 2 included in the multiplexer 20 of FIG. 6. A determination is made by configuration data recorded in a configuration memory 5 as to whether or not a connection state is made between terminals 80 and 81 of the two sides of a transmission gate 6.

It is to be noted that the configuration of the abovementioned reconfigurable circuit is merely one example. The number of inputs to the multiplexer 20 is arbitrary. Furthermore, multiplexers with different numbers of inputs may be mixed in an installation. Moreover, many configurations other than the abovementioned multiplexer configuration are known, and any multiplexer may be used. Furthermore, the number of functional block inputs, the number of wires, and wire length are not limited to the above described example.

Figure 8:
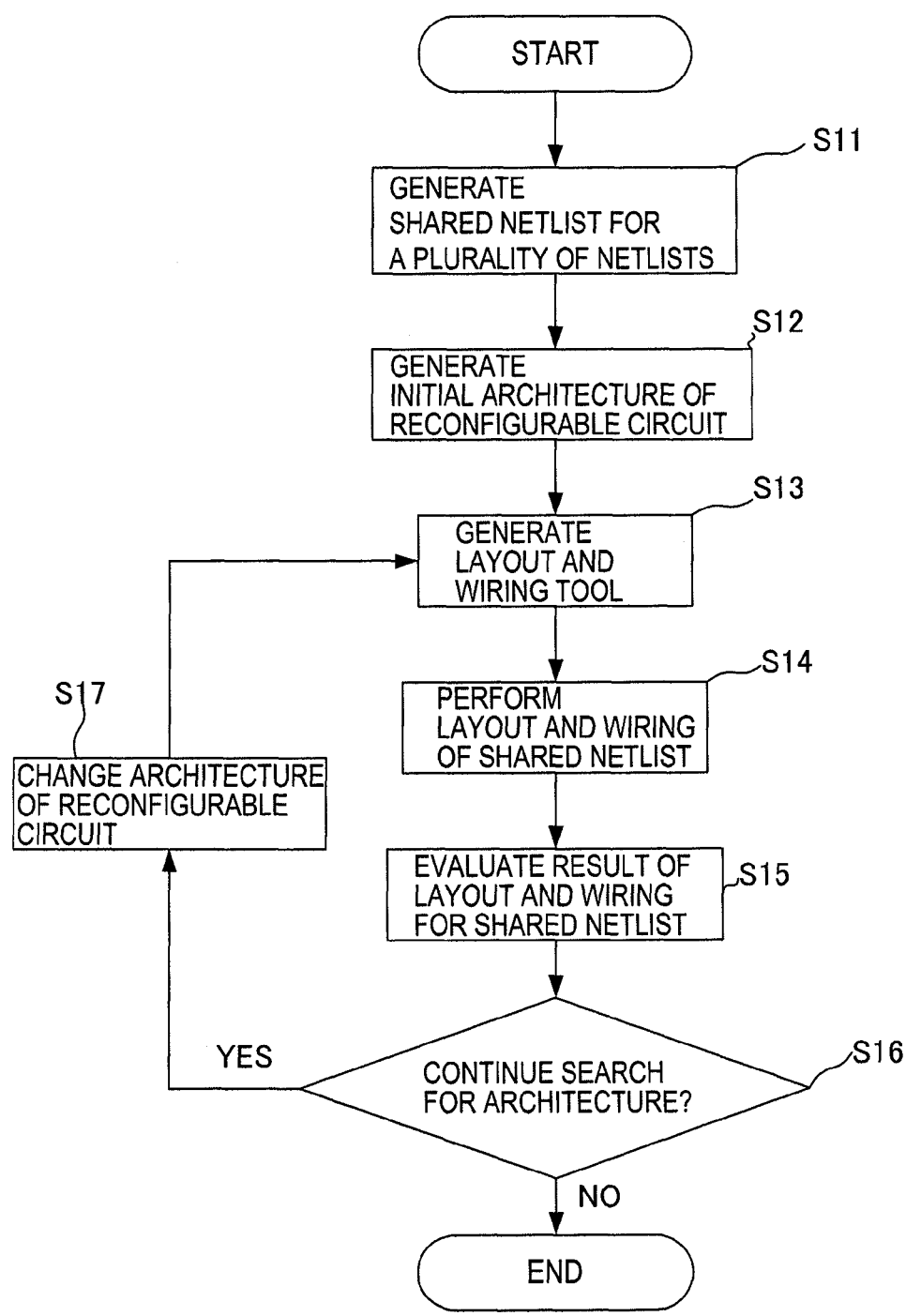
FIG. 8 is a flowchart of a reconfigurable circuit generation method according to an example.

A description will be given next concerning an example of the present invention. FIG. 8 is a flowchart of a reconfigurable circuit generation method according to the present example.

Referring to FIG. 8, first, common places of a plurality of netlists are superimposed as much as possible, and a shared netlist that can be shared among the plurality of netlists is generated (step S11). Next, an architecture of the reconfigurable circuit as a starting point, that is, an initial architecture, is generated (step S12). The initial architecture is a reconfigurable circuit provided with plenty of routing resources such as wires, switches, and the like, and is such that arbitrary netlists can be implemented thereon.

Next, a layout and wiring tool that gives consideration to configuration of the initial architecture is generated (step S13). Then, using the layout and wiring tool, layout and wiring is performed for the shared netlist generated in step S11, in the initial architecture (step S14). Next, a result of the layout and wiring of the shared netlist is evaluated (step S15). The evaluation may be performed, for example, based on whether or not the layout and wiring has been performed. In addition, the evaluation may be performed based on a maximum delay or power consumption of the application circuit in a case where the layout and wiring has been performed, the number of switches or circuit area of the reconfiguration circuit in a case where the layout and wiring has been performed, or a combination of these (for example, the product of the circuit area and the delay). A decision as to which evaluation method is to be used is made according to a designer's objective.

Next, based on the evaluation result, a decision is made as to whether or not to continue a search for an architecture of the reconfigurable circuit (step S16). The decision as to whether or not to continue the search for the architecture is made in accordance with a condition decided by the designer. For example, in a case where the layout and wiring could not be done, or in a case where an improvement in the delay is no longer seen, the search for an architecture may be ended (NO in step S16).

In a case of continuing the search for an architecture (YES in step S16), after changing the architecture of the reconfigurable circuit (step S17), steps from step S13 onwards are preformed using the architecture after it has been changed. As an architecture change (step S17), for example, a portion of the switches (2A to 2D in FIG. 6) of the multiplexer 20 of FIG. 5 may be eliminated or a portion of wirings 30, 31 connecting the cells of FIG. 4 may be eliminated.

From the above, in a range in which it is possible to perform layout and wiring of all the netlists, it is possible to generate the reconfigurable circuit in which the routing resources have been reduced as much as possible.

Figure 9A:
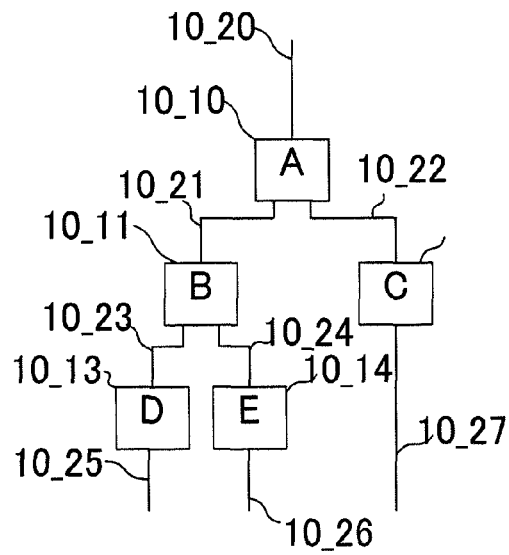
FIG. 9A is an example of a first netlist.

FIG. 9 is a diagram illustrating a method of generating a shared netlist by superimposing a plurality of netlists. FIG. 9A shows a first netlist 10. Referring to FIG. 9A, operation blocks 10_1*i* (i is an integer) of the netlist 10 are each assigned to a functional block 50 (FIG. 5) of one cell 1 of the reconfigurable circuit. In FIG. 9A, reference symbols A to E attached to the respective operation blocks 10_1*i* indicate types of operation. Nets 10_2*i* (i is an integer) correspond to wiring connecting operation blocks of the netlist 10, or input output signal lines of the netlist 10.

Figure 9B:
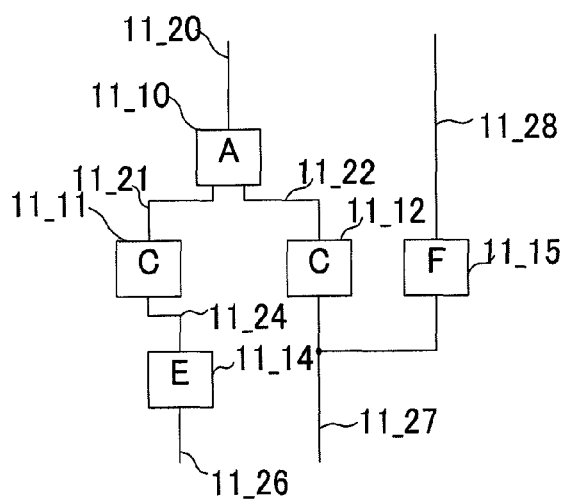
FIG. 9B is an example of a second netlist.

FIG. 9B is an example of a second netlist 11. Referring to FIG. 9B, operation blocks 11_1*i* (i is an integer) of the netlist 11 are each assigned to a functional block 50 (FIG. 5) of one cell 1 of the reconfigurable circuit. In FIG. 9B, reference symbols A to E attached to the respective operation blocks 11_1*i* indicate types of operation. Nets 11_2*i* (i is an integer) correspond to wiring connecting operation blocks of the netlist 11, or input output signal lines of the netlist 11.

Figure 9C:
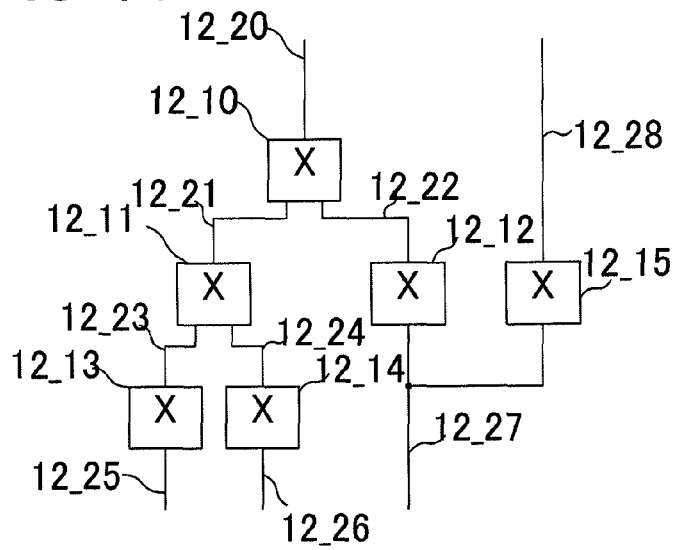
FIG. 9C is an example of a shared netlist.

FIG. 9C is an example of a shared netlist 12, with the first netlist 10 and the second netlist 11 superimposed. Referring to FIG. 9C, operation blocks 12_1*i* (i is an integer) of the shared netlist 12 are each assigned to a functional block 50 (FIG. 5) of one cell 1 of the reconfigurable circuit. Nets 12_2*i* (i is an integer) correspond to wiring connecting operation blocks of the shared netlist 12, or input output signal lines of the shared netlist 12.

In FIG. 9C, a reference symbol X attached to an operation block 12_1*i* indicates an arbitrary operation that can be realized in the functional block 50. In a case where a judgment is made as to whether or not layout and wiring can be performed for a netlist in the reconfigurable circuit, a function of an operation block of the netlist may be any function that can be realized by a functional block of the reconfigurable circuit. The function of the operation block is not related to whether or not it is possible to perform layout and wiring.

The shared netlist 12 includes the first netlist 10 and the second netlist 11. In fact, if an operation block 12_15 and a net 12_28 are eliminated from the shared netlist 12, and functions of each operation block are appropriately set, an equivalent to the first netlist 10 is obtained. Furthermore, if an operation block 12_13 and nets 12_28 and 12 25 are eliminated from the shared netlist 12, and functions of each operation block are appropriately set, an equivalent to the netlist 11 is obtained.

Therefore, in a case where layout and wiring of the shared netlist 12 is possible in the reconfigurable circuit, layout and wiring of both the first netlist 10 and the second netlist 11 in the reconfigurable circuit is possible.

Here, a description has been given with a case of two netlists as an example, but the number of netlists is arbitrary. By superimposing all netlists on one shared netlist, and having this shared netlist as a target for layout and wiring, it is possible to investigate the possibility of layout and wiring of all the netlists by one layout and wiring. By using this type of shared netlist, processing time for generating the reconfigurable circuit can be considerably shortened.

In addition, by using the shared netlist, an effect is produced of reducing the area of the reconfigurable circuit. Each of the operation blocks 12_1*i* (i is an integer) of the shared netlist 12 of FIG. 9 respectively corresponds to the operation blocks 10_1*i* of the netlist 10, and the operation blocks 11_1*i* of the netlist 11. In addition, each of the nets 12_2*i* of the shared netlist 12 of FIG. 9 respectively corresponds to the nets 10_2*i* of the netlist 10, and the operation blocks 11_2*i* of the netlist 11.

It is to be noted that the operation blocks, i=0, 1, 2, and 4, and the nets, i=0, 1, 2, 4, 6, and 7, are commonly present in both netlists of FIG. 9A and 9B, and network structures formed by these are identical in both netlists. In this way, the shared netlist 12 has a structure where a common portion, in which network structures in a plurality of netlists are the same, is used as it is, and also differences between the plurality of netlists and the common portion are added to the common portion. By eliminating places corresponding to the differences, from the shared netlist 12, any netlist among the plurality of netlists is obtained.

Figure 10A:
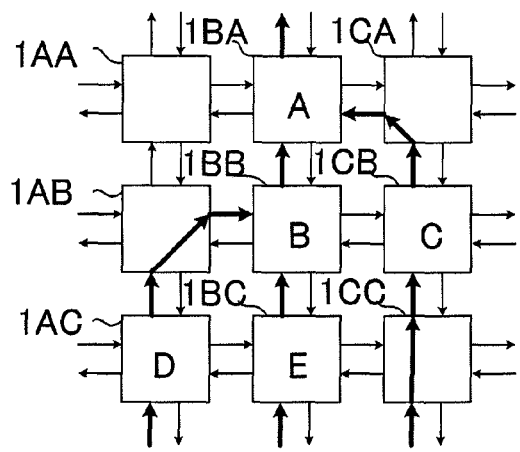
FIG. 10A is a diagram showing a result of performing layout and wiring of a first netlist in a reconfigurable circuit.
Figure 10B:
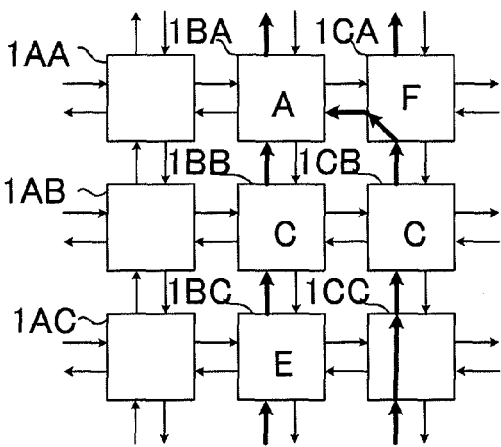
FIG. 10B is a diagram showing a result of performing layout and wiring of a second netlist in a reconfigurable circuit.
Figure 10C:
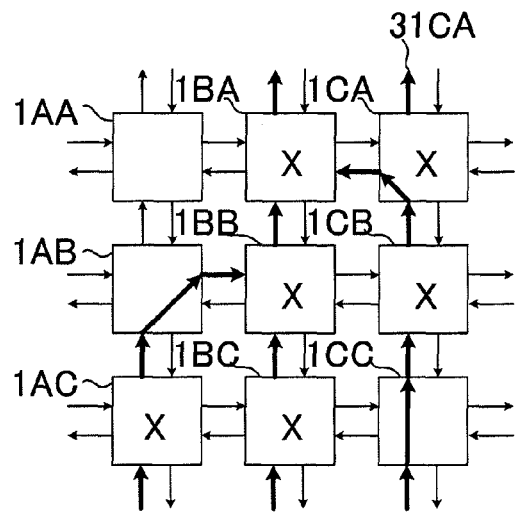
FIG. 10C is a diagram showing a result of performing layout and wiring of a shared netlist in a reconfigurable circuit.

FIG. 10C illustrates layout and wiring of the shared netlist 12 of FIG. 9C in the reconfigurable circuit of FIG. 4. Thick arrows correspond to the nets 12_2*i* (i is an integer). Arrows inside the cells 1AB, 1CC, and 1CA indicate that a function transmitting a signal to output (thick line) from input (thick line) of a cell is mapped. A cell in which a reference symbol is attached inside the cell is a cell where a functional block thereof is used (some operation is performed). A cell in which a reference symbol is not attached inside the cell is a cell where a functional block thereof is not used. Furthermore, an arrow shown by a thin line represents unused wiring.

Cells 1AC, 1BC, 1BB, 1CB, 1BA, and 1CA, of FIG. 10C, respectively correspond to operation blocks 12_13, 12_14, 12_11, 12_12, 12_10, and 12_15, of FIG. 9C.

The netlist 10 of FIG. 9A is obtained by removing the operation block 12_15 and net 12_28 of the shared netlist 12 of FIG. 9C, and setting functions of an appropriate operation block. Corresponding to this, a result of layout and wiring of the netlist 10 shown in FIG. 10 is obtained by having, with regard to FIG. 10C, a functional block and a net 31A of cell 1CA unused, and by appropriately setting functions of functional blocks of other cells in which the X symbol is written.

The netlist 11 of FIG. 9B is obtained by removing the operation block 12_13 and nets 12_23 and 12_25 from the shared netlist 12 of FIG. 9C, and setting functions of an appropriate operation block. Corresponding to this, a result of layout and wiring of the netlist 11 shown in FIG. 10B is obtained by having, with regard to FIG. 10C, a functional block and input output paths related thereto of cell 1AC unused, and by appropriately setting functions of functional blocks of other cells in which the X symbol is written.

In a case of obtaining layout and wiring of each netlist using the shared netlist, layout and wiring is performed for the same resources (cells and wires) for all common portions among the netlists. On the other hand, in a case of performing layout and wiring of the netlists individually, layout and wiring of the common portions among the netlists is not necessarily performed for the same resources. In a case where layout and wiring of the common portions among the netlists is not performed for the same resources, since unused recourses decrease, it is difficult to reduce the area of the reconfigurable circuit.

Figure 11:
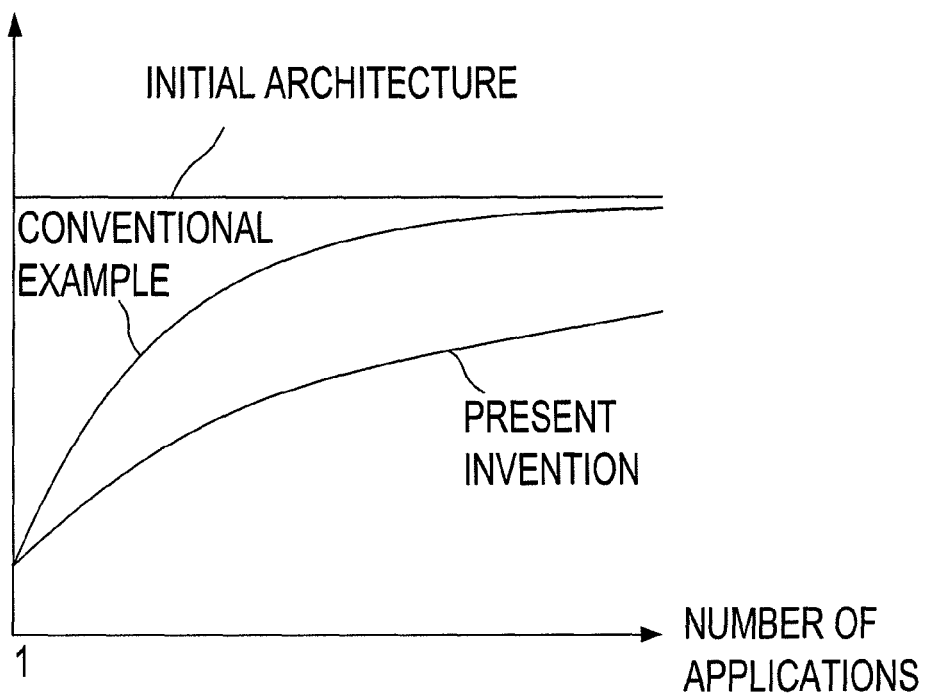
FIG. 11 is a graph showing application number dependency on number of resources of an application specific reconfigurable circuit.
Figure 12:
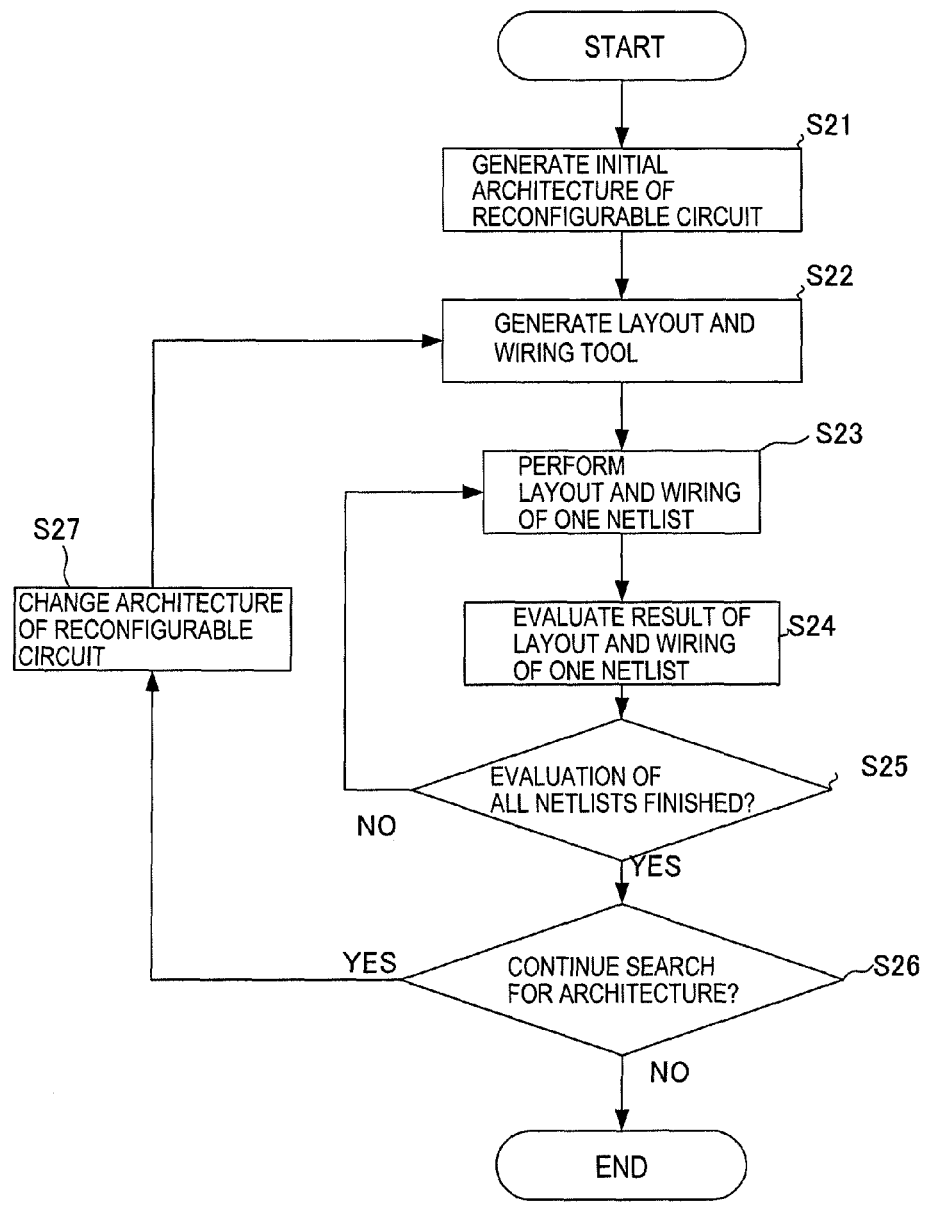
FIG. 12 is a flowchart of a conventional application specific reconfigurable circuit generation method.

FIG. 11 shows the number of resources (switches and wires) of a reconfigurable circuit, with respect to the number of netlists. A case where the layout and wiring of netlists is performed individually is shown as a conventional example. A case where the layout and wiring is performed for a shared netlist that can be shared among all the netlists is shown as the present invention. As the number of netlists increases, in the present invention the number of resources becomes less than the conventional example. This is because in the conventional example, the layout and wiring of the common portions of the netlists is not performed for the same resources, and the influence of uneven layout and wiring increases as the number of netlists increases. On the other hand, in the present invention, by using the shared netlist in the layout and wiring, since there is no unevenness in the common portions, the number of required resources is reduced, and it is possible to generate a reconfigurable circuit of smaller area than conventionally.

The more common portions there are among the netlists, the more resources can be reduced in the reconfigurable circuit. Therefore, it is preferable to perform a trial and error process of various matching methods among all the netlists, and to find a matching method in which common portions are greatest. Furthermore, when matching is performed, differences in functions of operation blocks among the netlists may be ignored and a search made for places where the nets can be shared.

As a standard for measuring the size of common portions among the netlists, it is possible to use, for example, the number of operation blocks included in the common portions, the number of nets, or the number of inputs and outputs of the operation blocks, or a combination of these (for example, the sum or product of these). A search made be made for a method of matching in which this standard is maximized.

Second Example

A plurality of netlists may be classified into a plurality of groups, and a common netlist may be generated with respect to each of the groups. In this case, the common netlists generated are of the same number as the groups. With respect to this case, when resources in a reconfigurable circuit are reduced, it is necessary to evaluate whether or not layout and wiring of all the common netlists is possible. However, in comparison to a case where layout and wiring is performed for all netlists individually, since it is possible to reduce the number of times the layout and wiring is performed, it is possible to shorten the time for generating the reconfigurable circuit in which resources are reduced.

Furthermore, by using the common netlists in performing layout and wiring, in comparison to a case where layout and wiring is performed for all the netlists individually, it is possible to suppress unevenness in shared portions, and an effect of reducing the area of the reconfigurable circuit is produced. It is to be noted that by netlists for applications which have similar structures or functions being made to belong to the same group, it is possible to reduce the size of the shared netlists.

Third Example

After generating a plurality of shared netlists as in the abovementioned Second Example, a netlist that can be shared among the shared netlists may be further generated. In a case of once generating a shared netlist from multiple netlists, there may be a case in which a lot of time will be required for matching among the netlists. In such a case, after the netlists are divided into a plurality of groups, and shared netlists are generated for netlists belonging to each group, a netlist may be generated which can be shared among these shared netlists.

In the framework of entire disclosure of the present invention (including the claims), and based on its basic technological idea, exemplary embodiments or examples of the present invention may be changed and/or adjusted. Also it should be noted that in the framework of the claims of the present invention, any combinations or selections of various elements disclosed herein are possible. That is, needless to say, it is understood by those skilled in the art that various changes or modifications can be made to the present invention based on the disclosure of the present invention including the claims and the technological idea of the present invention.

The invention claimed is:

1. A reconfigurable circuit generation device comprising:
   a netlist generation unit that generates a merged netlist including a plurality of netlists which are to be implemented on a first reconfigurable circuit, the merged netlist comprising a common portion among the plurality of netlists and differences between the common portion and the plurality of netlists; and
   a resource reduction unit that reduces resources from the first reconfigurable circuit to generate a second reconfigurable circuit on which the merged netlist can be implemented;
   said common portion includes an operation block and net connecting operation blocks.

2. The reconfigurable circuit generation device according to claim 1, wherein
   said plurality of netlists and said merged netlist respectively include operation blocks and nets connecting said operation blocks; and
   said merged netlist shares nets as much as possible among said plurality of netlists.

3. The reconfigurable circuit generation device according to claim 1, wherein
   the resources of said reconfigurable circuit include functional blocks and routing resources connecting said functional blocks; and
   said resource reduction unit reduces said routing resources.

4. The reconfigurable circuit generation device according to claim 1, wherein said merged netlist is a smallest netlist that includes said plurality of netlists.

5. The reconfigurable circuit generation device according to claim 1, wherein said netlist generation unit further comprises:
   a classification unit that classifies said plurality of netlists into a plurality of groups; and
   a generation unit that generates as a merged netlist, for each of said plurality of groups, a netlist that is a common portion among said plurality of netlists included in each of said plurality of groups, added by differences between the common portion and each of the plurality of netlists included in each of said plurality of groups, wherein
   said resource reduction unit implements said shared netlists for said plurality of groups on said reconfigurable circuit by using resources necessary for implementing all of said merged netlists for said plurality of groups out of resources of said reconfigurable circuit.

6. The reconfigurable circuit generation device according to claim 1, wherein
   said netlist generation unit further comprises:
   a classification unit that classifies said plurality of netlists into a plurality of groups;
   a first generation unit that generates as a first merged netlist, for each of said plurality of groups, a netlist that is a common portion among said plurality of netlists included in each of said plurality of groups, added by differences between the common portion and each of the plurality of netlists included in each of said plurality of groups; and
   a second generation unit that generates as a second merged netlist a netlist that is a common portion among said first merged netlists, added by differences between the common portion and each of said first merged netlists, wherein
   said resource reduction unit implements said second merged netlist on said reconfigurable circuit by using resources necessary for implementing said second merged netlist out of resources of said reconfigurable circuit.

7. A reconfigurable circuit generation method executed by a computer, said reconfigurable circuit generation method comprising:
   generating a merged netlist including a plurality of netlists which are to be implemented on a first reconfigurable circuit, the merged netlist comprising a common portion among the plurality of netlists and differences between the common portion and the plurality of netlists; and
   reducing resources from the first reconfigurable circuit to generate a second reconfigurable circuit on which the merged netlist can be implemented;
   said common portion includes an operation block and net connecting operation blocks.

8. The reconfigurable circuit generation method according to claim 7, wherein
   said plurality of netlists and said merged netlist respectively include operation blocks and nets connecting said operation blocks; and
   said merged netlist shares nets as much as possible among said plurality of netlists.

9. The reconfigurable circuit generation method according to claim 7, wherein
   resources of said reconfigurable circuit include functional blocks and routing resources connecting said functional blocks; and
   said implementing comprises reducing said routing resources.

10. The reconfigurable circuit generation method according to claim 7, wherein said generating comprises:
    classifying said plurality of netlists into a plurality of groups; and
    generating as a merged netlist, for each of said plurality of groups, a netlist that is a common portion among said plurality of netlists included in each of said plurality of groups, added by differences between the common portion and each of the plurality of the netlists included in each of said plurality of groups, wherein
    said implementing comprises implementing said merged netlists for said plurality of groups on said reconfigurable circuit by using resources necessary for implementing all of said merged netlists for said plurality of groups out of resources of said reconfigurable circuit.

11. The reconfigurable circuit generation method according to claim 7, wherein said generating further comprises:
    classifying said plurality of netlists into a plurality of groups;
    generating as a first merged netlist, for each of said plurality of groups, a netlist that is a common portion among said plurality of netlists included in each of said plurality of groups, added by differences between the common portion and each of the plurality of netlists included in each of said plurality of groups; and
    generating as a second merged netlist a netlist that is a common portion among said first merged netlists, added by differences between the common portion and each of said first merged netlists, wherein
    said implementing comprises implementing said second merged netlist on said reconfigurable circuit by using resources necessary for implementing said second merged netlist out of resources of said reconfigurable circuit.

12. A non-transitory computer-readable storage medium storing a program that causes a computer to execute:
    generating a merged netlist including a plurality of netlists which are to be implemented on a first reconfigurable circuit, the merged netlist comprising a common portion among the plurality of netlists and differences between the common portion and the plurality of netlists; and
    reducing resources from the first reconfigurable circuit to generate a second reconfigurable circuit on which the merged netlist can be implemented;
    said common portion includes an operation block and net connecting operation blocks.

13. The program according to claim 12, wherein
    said plurality of netlists and said merged netlist respectively include operation blocks and nets connecting said operation blocks; and
    said merged netlist shares nets as much as possible among said plurality of netlists.

14. The program according to claim 12, wherein
    the resources of said reconfigurable circuit include functional blocks and routing resources connecting said functional blocks; and
    said reducing comprises reducing said routing resources.

15. The program according to claim 12, wherein said generating further comprises:
    classifying a plurality of netlists into a plurality of groups; and
    generating as a merged netlist, for each of said plurality of groups, a netlist that is a common portion among said plurality of netlists included in each of said plurality of groups, added by differences between the common portion and each of the plurality of the netlists included in each of said plurality of groups, wherein
    said implementing comprises implementing said merged netlists for said plurality of groups on said reconfigurable circuit by using resources necessary for implementing all of said merged netlists for said plurality of groups out of resources of said reconfigurable circuit.

16. The program according to claim 12, wherein said generating further comprises:
classifying a plurality of netlists into a plurality of groups;
generating as a first merged netlist, for each of said plurality of groups, a netlist that is a common portion among said plurality of netlists included in each of said plurality of groups, added by differences between the common portion and each of the plurality of the netlists included in each of said plurality of groups; and
generating as a second merged netlist a netlist that is a common portion among said first merged netlists, added by differences between the common portion and each of said first shared netlists, wherein
said implementing comprises implementing said second merged netlist on said reconfigurable circuit by using resources necessary for implementing said second merged netlist out of resources of said reconfigurable circuit.

* * * * *